United States Patent
Akita et al.

(10) Patent No.: US 8,619,828 B2
(45) Date of Patent: Dec. 31, 2013

(54) GROUP III NITRIDE SEMICONDUCTOR LASER DIODE

(75) Inventors: Katsushi Akita, Itami (JP); Yohei Enya, Itami (JP); Takashi Kyono, Itami (JP); Masahiro Adachi, Osaka (JP); Shinji Tokuyama, Osaka (JP); Yusuke Yoshizumi, Itami (JP); Takamichi Sumitomo, Itami (JP); Masaki Ueno, Itami (JP)

(73) Assignee: Sumitomo Electronic Industries, Ltd., Osaka-shi (JP)

( * ) Notice: Subject to any disclaimer, the term of this patent is extended or adjusted under 35 U.S.C. 154(b) by 483 days.

(21) Appl. No.: 12/836,065

(22) Filed: Jul. 14, 2010

(65) Prior Publication Data

US 2011/0013656 A1    Jan. 20, 2011

(30) Foreign Application Priority Data

Jul. 14, 2009    (JP) ............................... P2009-165889

(51) Int. Cl.
*H01S 5/343*    (2006.01)

(52) U.S. Cl.
USPC ............. 372/45.011; 372/43.01; 372/45.01

(58) Field of Classification Search
USPC .................................................. 372/45.011
See application file for complete search history.

(56) References Cited

U.S. PATENT DOCUMENTS

| | | | |
|---|---|---|---|
| 7,088,755 B2 * | 8/2006 | Nomura et al. | ............. 372/45.01 |
| 2002/0031153 A1 | 3/2002 | Niwa et al. | |
| 2002/0053676 A1 | 5/2002 | Kozaki | |
| 2004/0056242 A1 * | 3/2004 | Ohno et al. | ...................... 257/13 |
| 2005/0030994 A1 * | 2/2005 | Kozaki et al. | ................... 372/43 |

(Continued)

FOREIGN PATENT DOCUMENTS

| | | |
|---|---|---|
| EP | 1 583 190 A1 | 10/2005 |
| EP | 1 670 106 A1 | 6/2006 |

(Continued)

OTHER PUBLICATIONS

Tyagi et al. "Stimulated Emission at Blue-Green (480 nm) and Green (514 nm) Wavelengths from Nonpolar (m-plane) and Semipolar (11-22) InGaN Multiple Quantum Well Laser Diode Structures," Applied Physics Express, vol. 1, No. 9, pp. 091103-1-091103-3, (Sep. 2008).

(Continued)

*Primary Examiner* — Xinning Niu
(74) *Attorney, Agent, or Firm* — Venable LLP; Michael A. Sartori; Tamatane J. Aga

(57) ABSTRACT

A group III nitride substrate has a semi-polar primary surface. A first cladding layer has a first conductivity type, and comprises aluminum-containing group III nitride. The first cladding layer is provided on the substrate. An active layer is provided on the first cladding layer. A second cladding layer has a second conductivity type, and comprises aluminum-containing group III nitride. The second cladding layer is provided on the active layer. An optical guiding layer is provided between the first cladding layer and the active layer and/or between the second cladding layer and the active layer. The optical guiding layer comprises a first layer comprising $In_{x1}Ga_{1-x1}N$ ($0 \leq x1 < 1$) and a second layer comprising $In_{x2}Ga_{1-x2}N$ ($x1 < x2 < 1$). The second layer is provided between the first layer and the active layer. The total thickness of the first layer and the second layer is greater than 0.1 μm. The wavelength of laser light is in a range of 480 nm to 550 nm.

20 Claims, 8 Drawing Sheets

(56) References Cited

U.S. PATENT DOCUMENTS

| | | | |
|---|---|---|---|
| 2005/0224783 A1 | 10/2005 | Matsuyama et al. | |
| 2005/0265411 A1* | 12/2005 | Takeuchi et al. | 372/39 |
| 2007/0032046 A1* | 2/2007 | Dmitriev et al. | 438/478 |
| 2007/0290230 A1 | 12/2007 | Kawaguchi et al. | |
| 2008/0056322 A1* | 3/2008 | Masui et al. | 372/45.012 |
| 2008/0151957 A1* | 6/2008 | Tachibana et al. | 372/45.01 |
| 2008/0192788 A1 | 8/2008 | Matsuyama et al. | |
| 2008/0285609 A1* | 11/2008 | Ohta et al. | 372/44.011 |

FOREIGN PATENT DOCUMENTS

| | | |
|---|---|---|
| JP | 2000-299532 A | 10/2000 |
| JP | 2002-016000 A | 1/2002 |
| JP | 2002-270971 A | 9/2002 |
| JP | 2008-311640 A | 12/2008 |
| JP | 2009-054616 A | 3/2009 |
| JP | 2010-177651 A | 8/2010 |
| WO | WO-2008/060531 A2 | 5/2008 |
| WO | WO-2009/048131 A1 | 4/2009 |

OTHER PUBLICATIONS

Notice of Reasons for Rejection in Japanese Patent Application No. 2009-165889, dated Feb. 12, 2013.

* cited by examiner

Fig. 2

| | GROWTH TEMPERATURE [°C] | GROWTH RATE [Å/min] | TMGa [μmol/min] | TMIn [μmol/min] | TMAl [μmol/min] | NH$_3$ [slm] |
|---|---|---|---|---|---|---|
| p+GaN | 1100 | 180 | 34.1 | — | — | 5 |
| p-Al$_{0.06}$GaN | 1100 | 130 | 36.6 | — | 3.0 | 6 |
| p-GaN | 1100 | 580 | 98.7 | — | — | 5 |
| p-InGaN | 840 | 67 | 24.4 | 4.6 | — | 6 |
| p-Al$_{0.18}$GaN | 1100 | 49 | 16.6 | — | 2.8 | 6 |
| UNDOPED InGaN | 840 | 67 | 24.4 | 4.6 | — | 6 |
| InGaN INTERLAYER | 745 | 31 | 15.6 | 0.3 | — | 8 |
| InGaN WELL LAYER | 745 | 31 | 15.6 | 29.0 | — | 8 |
| InGaN BARRIER LAYER | 870 | 67 | 24.4 | 1.6 | — | 6 |
| UNDOPED InGaN | 840 | 67 | 24.4 | 4.6 | — | 6 |
| n-GaN | 1150 | 580 | 98.7 | — | — | 5 |
| n-AlGaN | 1150 | 460 | 98.7 | — | 8.2 | 6 |
| PRETREATMENT | 1100 | — | — | — | — | 10 |

GROUP III NITRIDE SEMICONDUCTOR LASER DIODE

BACKGROUND OF THE INVENTION

1. Field of the Invention

The present invention relates to a group III nitride semiconductor laser diode.

2. Related Background Art

Patent Literature 1 discloses a Fabry-Perot semiconductor laser diode having a lasing wavelength band of 500 nm or longer. The semiconductor laser diode has n-type semiconductor layers, a light emitting layer, and p-type semiconductor layers. These layers are stacked on a primary surface of a GaN substrate. The primary surface includes a non-polar m-plane. The n-type semiconductor layers include an n-type GaN cladding layer and an n-type InGaN optical guiding layer. The p-type semiconductor layers include a p-type GaN cladding layer and a p-type InGaN optical guiding layer.

Patent Literature 2 discloses a laser device having a lasing wavelength band of 425 nm to 450 nm. The laser device has an n-type GaN cladding layer, an active layer, and a p-type cladding layer. These layers are stacked on a primary surface of a GaN substrate. The primary surface includes a c-plane. In addition, the laser device has GaN optical guiding layers. A GaN optical guiding layer is provided between the n-type cladding layer and the active layer. The other GaN optical guiding layer is provided between the p-type cladding layer and the active layer. An indium-containing nitride semiconductor layer is provided between the GaN optical guiding layer and the active layer.

PRIOR ART DOCUMENT

Patent Literature

Patent Literature 1: Japanese Unexamined Patent Application Publication No. 2008-311640
Patent Literature 2: Japanese Unexamined Patent Application Publication No. 2002-270971

SUMMARY OF THE INVENTION

A laser diode including group III nitride semiconductor can have a long lasing wavelength, for example, about 500 nm. Such a long wavelength laser diode has an active layer composed of indium-containing group III nitride semiconductor. Furthermore, optical guiding layers composed of indium-containing group III nitride semiconductor are disposed on the upper surface and the lower surface, respectively, of the active layer in order to confine light stably to the light emitting layer.

A stable lasing mode with a long wavelength of about 500 nm requires thick optical guiding layers having a thickness, for example, exceeding 100 nm. But, when the optical guiding layer composed of indium-containing group III nitride semiconductor grown on a GaN substrate has a thickness near the critical thickness, a crystalline quality of the optical guiding layer may be poor. In the case where a plane for the crystalline growth is semi-polar, the c-plane behaves like a sliding plane, resulting in a significant reduction in crystalline quality. Furthermore, a higher indium composition in the optical guiding layer is necessary for a larger optical confinement factor Γ well. An increase in the indium composition in the optical guiding layer will lead to a poorer crystalline quality.

In the laser device described in Patent Literature 2, an InGaN active layer and other layers are grown on a GaN substrate having a primary surface including a c-plane. In this case, if the indium composition of the InGaN active layer is controlled so as to emit light of a long wavelength such as 500 nm, the luminous efficiency decreases by a piezoelectric field which is induced by a lattice-constant difference. Accordingly, it is difficult to achieve a practical long-wavelength laser diode.

In an aspect of the present invention, a group III nitride semiconductor laser diode comprises (1) a group III nitride substrate having a semi-polar primary surface, (2) a first cladding layer having a first conductivity type, the first cladding layer comprising aluminum-containing group III nitride, the first cladding layer being provided on the group III nitride substrate, (3) an active layer provided on the first cladding layer, (4) a second cladding layer having a second conductivity type, the second cladding layer comprising aluminum-containing group III nitride, the second cladding layer being provided on the active layer, (5) an optical guiding layer provided between the first cladding layer and the active layer and/or between the second cladding layer and the active layer, the optical guiding layer comprising a first layer and a second layer, the first layer comprising $In_{x1}Ga_{1-x1}N$ ($0 \leq x1 < 1$), the second layer comprising $In_{x2}Ga_{1-x2}N$ ($x1 < x2 < 1$), the second layer being provided between the first layer and the active layer, the total thickness of the first layer and the second layer being greater than 0.1 μm, and (6) the wavelength of laser light being in a range of 480 nm to 550 nm.

The group III nitride laser diode may further comprise an electron-blocking layer. When the optical guiding layer is provided between the second cladding layer and the active layer, the optical guiding layer may be separated by the electron-blocking layer into two parts arranged in a thickness direction. In this case, the distance between the electron-blocking layer and the active layer is preferably more than or equal to 50 nm.

The total thickness of the first layer and the second layer may be less than 0.5 μm.

An indium composition x2 in the second layer may be in a range of 0.01 to 0.1.

The thickness d2 (nm) of the second layer may satisfy the following relation:

$$d2 < -5000 \times x2 + 315$$

where x2 is an indium composition of the second layer.

The group III nitride substrate may comprise $In_S Al_T Ga_{1-S-T}N$ ($0 \leq S \leq 1$, $0 \leq T \leq 1$, $0 \leq S+T \leq 1$). The primary surface may be tilted at an angle of more than or equal to 10 degrees and less than 90 degrees with respect to one of a (0001) plane and a (000-1) plane of the $In_S Al_T Ga_{1-S-T}N$ crystal. In this case, preferably, the primary surface may be tilted at an angle of more than or equal to 63 degrees and less than 80 degrees with respect to one of the (0001) plane and the (000-1) plane of the $In_S Al_T Ga_{1-S-T}N$ crystal.

The group III nitride substrate may comprise GaN.

The primary surface may be tilted in an m-axis direction of $In_S Al_T Ga_{1-S-T}N$ crystal.

The present invention will be more fully understood from the detailed description given herein below and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 2 is a table showing a growth temperature, a growth rate, a flow rate of TMIn, a flow rate of TMAl, and a flow rate of $NH_3$ of each semiconductor layer of a group III nitride semiconductor laser diode in a exemplary manufacturing process.

DETAILED DESCRIPTION OF THE PREFERRED EMBODIMENTS

Embodiments of the present invention will be explained in detail with reference to the attached drawings. The same or equivalent parts will be referred to with the same signs in the explanation of the drawings.

First Embodiment

Figure 1:
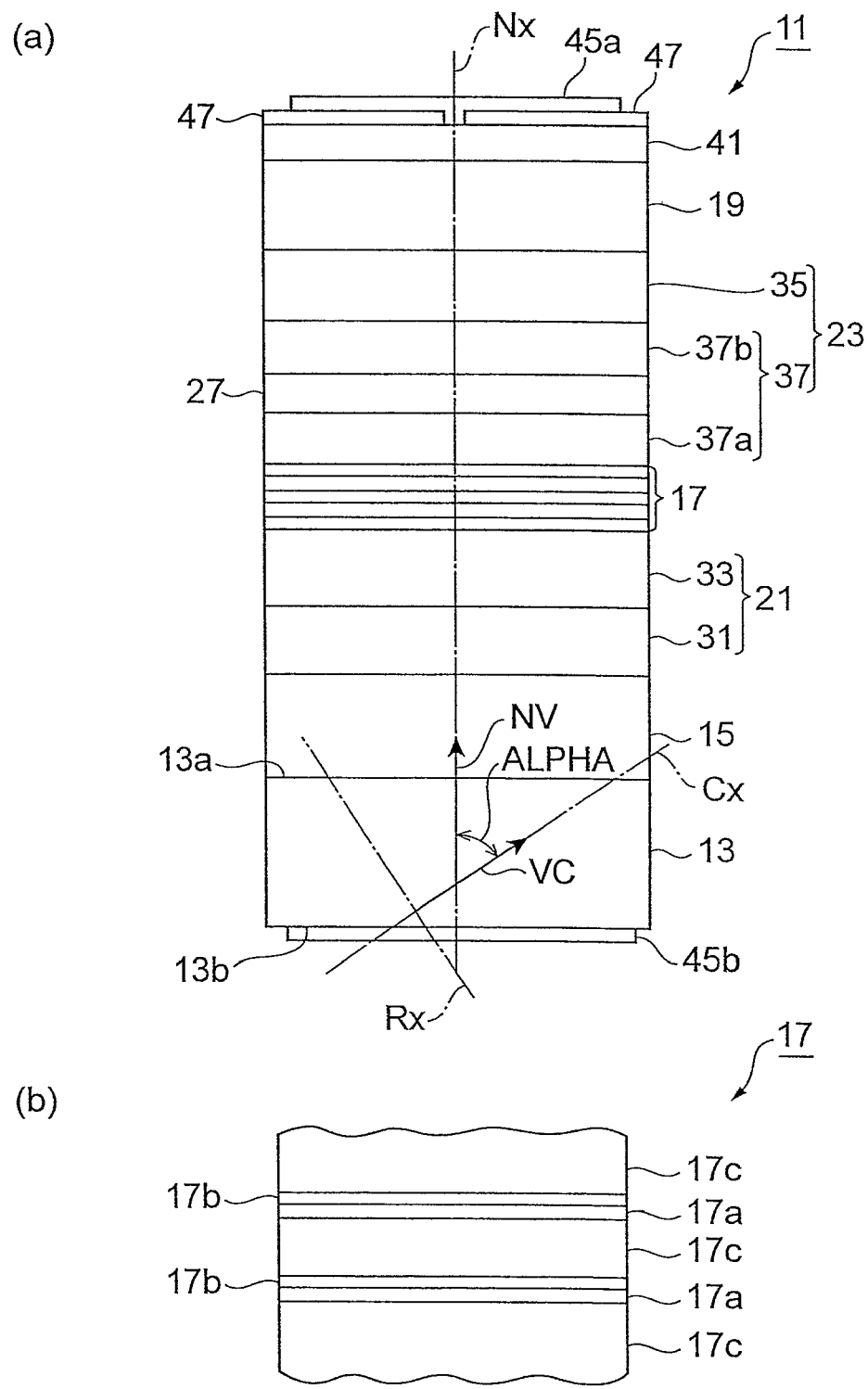
FIG. 1 is a schematic view illustrating the structure of a group III nitride semiconductor laser diode in accordance with a first embodiment of the present invention.

Part (a) of FIG. 1 is a schematic view illustrating the structure of a group III nitride semiconductor laser diode 11 in accordance with a first embodiment. The group III nitride semiconductor laser diode 11 will be explained in reference to Part (a) of FIG. 1. The group III nitride semiconductor laser diode 11 is a gain-guided laser diode. The group III nitride semiconductor laser diode 11 outputs laser light having a wavelength in the range of 480 nm to 550 nm.

The group III nitride semiconductor laser diode 11 includes a group III nitride substrate 13, an n-type cladding layer 15, an active layer 17, and a p-type cladding layer 19. The n-type cladding layer 15 is provided on the group III nitride substrate 13. The active layer 17 is provided on the n-type cladding layer 15. The p-type cladding layer 19 is provided on the active layer 17. The group III nitride substrate 13 comprises a hexagonal semiconductor $In_SAl_TGa_{1-S-T}N$ ($0 \le S \le 1$, $0 \le T \le 1$, $0 \le S+T \le 1$). The group III nitride substrate 13 may comprise, for example, GaN. The group III nitride substrate 13 has a semi-polar primary surface 13a and a back surface 13b. The primary surface 13a is tilted with respect to the c-plane of the group III nitride crystal. More preferably, the primary surface 13a is tilted in the m-axis direction of the group III nitride crystal. The n-type cladding layer 15 comprises an aluminum-containing n-type (a first conductivity type) group III nitride. The n-type cladding layer 15 may comprise, for example, AlGaN, or InAlGaN. The n-type cladding layer 15 functions as a first cladding layer in the embodiment. The p-type cladding layer 19 comprises an aluminum-containing p-type (a second conductivity type) group III nitride. The p-type cladding layer 19 may comprise, for example, AlGaN or InAlGaN. The p-type cladding layer 19 functions as a second cladding layer in the embodiment.

The active layer 17 may consist of a single layer. Alternatively, the active layer 17 may have a quantum well structure. If necessary, the quantum well structure may include well layers and barrier layers alternately stacked one another. Part (b) of FIG. 1 is a schematic view of the active layer 17 having such quantum well structure. The active layer 17 includes repeating units each including a well layer 17a, an interlayer 17b, and a barrier layer 17c. The well layer 17a may comprise, for example, InGaN. The barrier layer 17c may comprise, for example, InGaN or GaN such that the barrier layer 17c has a band gap energy higher than that of the well layer 17a. The interlayer 17b may comprise, for example, InGaN or GaN such that the interlayer 17b has a band gap energy higher than that of the well layer 17a. The interlayer 17b between the well layer 17a and the barrier layer 17c can decrease a threshold voltage or minimum drive voltage of the group HT nitride semiconductor laser diode 11.

In an embodiment, the thickness of the well layer 17a may be, for example, 3 nm. The thickness of the interlayer 17b may be, for example, 1.1 nm. The thickness of the bather layer 17c may be, for example, 13.9 nm. The number of the well layers 17a may be, for example, three. The luminous wavelength of the active layer 17 may be controlled by, for example, the band gap, the indium composition and the thickness of the well layer 17a. The active layer 17 may be provided to emit light in the wavelength range of 480 nm to 550 nm.

The group III nitride semiconductor laser diode 11 includes a first optical guiding layer 21 between the n-type cladding layer 15 and the active layer 17. The group III nitride semiconductor laser diode 11 further includes a second optical guiding layer 23 between the active layer 17 and the p-type cladding layer 19. The first optical guiding layer 21 and the second optical guiding layer 23 are provided to decrease the threshold voltage by confining light to the active layer 17 without allowing light to leak to the group III nitride substrate 13.

As shown in FIG. 1, the first optical guiding layer 21, the active layer 17, and the second optical guiding layer 23 are aligned along the normal axis Nx on the primary surface 13a of the group III nitride substrate 13. The tilt angle of the primary surface 13a of the group III nitride substrate 13 is defined by an angle ALPHA. The angle ALPHA is an angle between a normal vector NV indicating a normal axis Nx and the c-axis vector VC indicating the direction of the c-axis. The angle ALPHA may be in the range of more than or equal to 10 degrees to less than 90 degrees with respect to a standard plane Rx. The standard plane Rx is perpendicular to the c-axis of the group III nitride, that is one of the (0001) plane and the (000-1) plane. Alternatively the angle ALPHA may be in the range of more than 90 degrees to not more than 170 degrees with respect to the standard plane Rx. The group III nitride substrate 13 may be, for example, GaN which can provide semi-polar property at a tilt angle within the range. The tilt angle ALPHA is preferably in the range of more than or equal to 63 degrees to less than 80 degrees, or more than 100 degrees and not more than 117 degrees. At a tilt angle within the range, the InGaN layer can have an indium composition suitable for the active layer 17, which emits light with a long wavelength such as 500 nm.

The first optical guiding layer 21 may include a first layer 31 and a second layer 33. The first layer 31 may comprise $In_{x2}Ga_{1-x2}N$ (0≤x1<1). The second layer 33 may comprise $In_{x2}Ga_{1-x2}N$ (x1<x2<1). The first layer 31 is disposed on the n-type cladding layer 15. The second layer 33 is disposed between the first layer 31 and the active layer 17. The indium composition x2 of the second layer 33 is higher than the indium composition x1 of the first layer 31. The indium composition x2 of the second layer 33 is lower than the indium composition of an InGaN well layer of the active layer 17. In an embodiment, the first layer 31 may comprise n-type GaN, and the second layer 33 may comprise undoped InGaN.

The second optical guiding layer 23 may include a first layer 35 and a second layer 37. The first layer 35 may comprise $In_{x1}Ga_{1-x1}N$ (0≤x1<1). The second layer 37 may comprise $In_{x2}Ga_{1-x2}N$ (x1<x2<1). The first layer 35 is disposed on the active layer 17. The second layer 37 is disposed between the active layer 17 and the first layer 35. The indium composition x2 of the second layer 37 is higher than the indium composition x1 of the first layer 35. The indium composition x2 of the second layer 37 is lower than the indium composition of an InGaN well layer of the active layer 17. In an embodiment, the first layer 35 comprises p-type GaN, and the second layer 37 may comprise undoped or p-type InGaN.

The total thickness of the first layer 31 and the second layer 33 is set to more than 0.1 µm to stabilize a lasing mode. The total thickness of the first layer 35 and the second layer 37 is also set to more than 0.1 µm to stabilize a lasing mode. The total thickness of the first layer 31 and the second layer 33 is set to less than 0.5 µm to increase the optical confinement factor Γ well, resulting in enhanced lasing efficiency. The total thickness of the first layer 35 and the second layer 37 is also set to less than 0.5 µm to increase the optical confinement factor Γ well, resulting in enhanced lasing efficiency.

The indium composition x2 in the second layers 33 and 37 is preferably in the range of 0.01 to 0.1. Since an indium composition x2 of 0.01 or more can provide a sufficiently high refractive index, the optical confinement factor Γ well can be increased. This further enhances lasing efficiency. Furthermore, the indium composition x2 of 0.1 or less can maintain high crystalline quality in the active layer 17, and thus can achieve high luminous efficiency.

The group III nitride semiconductor laser diode 11 further includes an electron-blocking layer 27. The electron-blocking layer 27 is provided to separate the second optical guiding layer 23 into two parts arranged in a thickness direction. In the embodiment, the electron-blocking 27 layer is provided to separate the second layer 37 into two parts arranged in a thickness direction. Specifically, the second layer 37 is separated into a lower part 37a and an upper part 37b. The lower part 37a is disposed on the active layer 17. The upper part 37b is disposed between the lower part 37a and the first layer 35. The electron-blocking layer 27 is disposed between the lower part 37a and the upper part 37b. In an embodiment, the lower part 37a may comprise undoped InGaN, and the upper part 37b may comprise p-type InGaN. The electron-blocking layer 27 may comprise, for example, $Al_zGa_{1-z}N$ (0<z<1). The aluminum composition z is higher than the aluminum composition of p-type cladding layer 19. A gap between the electron-blocking layer 27 and the active layer 17 is preferably more than or equal to 50 nm. The gap is equal to the thickness of the lower part 37a in the embodiment.

In the group III nitride semiconductor laser diode 11, the first layers 31 and 35, and the upper part 37b of the second layer 37 are n-type or p-type, while the second layer 33 and the lower part 37a of the second layer 37 are undoped. Thus, the second layer 33 and the lower part 37a which are adjacent to the active layer 17 are undoped, so that light absorption by a dopant can be avoided. The layer 33 and the part 37a may, however, be doped for reducing resistance, so that the laser diode 11 can be driven by a low-voltage. The first layers 31 and 35, and the upper part 37b, which are doped, can have reduced resistances.

The group III nitride semiconductor laser diode 11 further includes a p-type contact layer 41 provided on the p-type cladding layer 19. The p-type contact layer 41 may comprise, for example, GaN or AlGaN. An anode electrode 45a is in contact with the p-type contact layer 41 via an aperture formed to an insulating layer 47. A cathode electrode 45b is in contact with the back surface 13b of the group III nitride substrate 13.

A preferred embodiment is described as follows. The thickness of the n-type cladding layer 15 is 2000 nm, and the aluminum composition of the layer 15 is 0.04. The thickness of the first layer 31 is 100 nm, and the indium composition x1 of the layer 31 is 0 (i.e., GaN). The thickness of the second layer 33 is 115 nm, and the indium composition x2 of the layer 33 is 0.02. The thickness of the first layer 35 is 100 nm, and the indium composition x1 of the layer 35 is 0 (i.e., GaN). The thickness of the lower part 37a is 65 nm, and the thickness of the upper part 37b is 50 nm. The indium composition x2 of the lower part 37a and the upper part 37b is 0.02. The thickness of the electron-blocking layer 27 is 20 nm, and the aluminum composition z of the layer 27 is 0.18. The thickness of the p-type cladding layer 19 is 400 nm, and the aluminum composition of the layer 19 is 0.06. The thickness of the p-type contact layer 41 is 50 nm. The anode electrode 45a comprises Ni/Au. The cathode electrode 45b comprises Ti/Al/Au. In this embodiment, the lasing wavelength is 497 nm, and the threshold current is 1.4 A.

Another preferred embodiment is described as follows. The thicknesses of the n-type cladding layer 15, electron-blocking layer 27, p-type cladding layer 19, and p-type contact layer 41 are the same as those in the above embodiment. The thickness of the first layers 31 and 35 is 250 nm, and the indium composition x1 of the first layers 31 and 35 is the same as that in the above embodiment. The thicknesses of the second layers 33 and 37 are the same as those in the above embodiment. The indium composition x2 of the second layers 33 and 37 is 0.03. In this embodiment, the lasing wavelength is 520 nm, and the threshold current is 4 A.

The group III nitride semiconductor laser diode 11 is made, for example, by the following procedure. A wafer for the group III nitride substrate 13 is provided. The wafer has a semi-polar primary surface. An n-type $Al_{0.04}GaN$ layer for the n-type cladding layer 15, an n-type GaN layer for the first layer 31, an undoped $In_{0.02}GaN$ layer for the second layer 33, a multi-quantum well InGaN layer for the active layer 17, an undoped $In_{0.02}GaN$ layer for the lower part 37a, a p-type $Al_{0.18}GaN$ layer for the electron-blocking layer 27, a p-type $In_{0.02}GaN$ layer for the upper part 37b, a p-type GaN layer for the first layer 35, a p-type $Al_{0.06}GaN$ layer for the p-type cladding layer 19, and a $p^+$-type GaN layer for the contact layer 41 are grown in sequence on the wafer by metal-organic chemical vapor deposition.

Examples of material gas used for growth of these semiconductor layers include trimethylgallium (TMGa), trimethylaluminum (TMAl), trimethylindium (TMIn), and ammonia ($NH_3$). Examples of the n-type and p-type dopants include silane, and bis(cyclopentadienyl)magnesium, respectively. FIG. 2 is a table showing the growth temperature (degree), the growth rate (angstrom per minute), the flow rate of TMGa (μmol/min), the flow rate of TMIn (μmol/min), the flow rate of TMAl (μmol/min), and the flow rate of $NH_3$ (standard liter per minute: slm) of each semiconductor layer in an embodiment.

The function and advantages of the group III nitride semiconductor laser diode 11 in accordance with the present embodiment will be explained. Because InGaN has a relatively high refractive index, it is preferable to use InGaN for an optical guiding layer of a long-wavelength group III nitride laser diode that has a lasing wavelength in the range of 480 nm to 550 nm. Since the diode can effectively confine light to the active layer, resulting in a stable lasing mode. However, an increase in the thickness of the optical guiding layer containing InGaN may cause a significant reduction in crystalline quality of the active layer.

In the group III nitride semiconductor laser diode 11 of the present embodiment, the first optical guiding layer 21 includes the first layer 31 and the second layer 33, and the second optical guiding layer 23 includes the first layer 35 and the second layer 37. The indium compositions x2 in the second layers 33 and 37 adjacent to the active layer 17 are higher than the indium compositions x1 in the first layers 31 and 35. Hereby, the second layers 33 and 37 having higher indium compositions can enhance light confinement to the active layer 17. In addition, the first layers 31 and 35, each having a lower indium composition, contribute to increases in the thicknesses of the optical guiding layers 21 and 23, while maintaining high crystalline quality of the active layer 17. Consequently, a stable lasing mode can be achieved by the optical guiding layers 21 and 23 each having a thickness exceeding 0.1 μm. This advantage is distinguished in the case where the group III nitride substrate 13 has the semi-polar primary surface.

In the present embodiment, the first optical guiding layer 21 is provided between the n-type cladding layer 15 and the active layer 17. The second optical guiding layer 23 is provided between the active layer 17 and the p-type cladding layer 19. When a single optical guiding layer provided between the n-type cladding layer 15 and the active light layer 17 or between the active layer 17 and the p-type cladding layer 19, a group III nitride semiconductor laser diode also has the same advantage.

Figure 3:
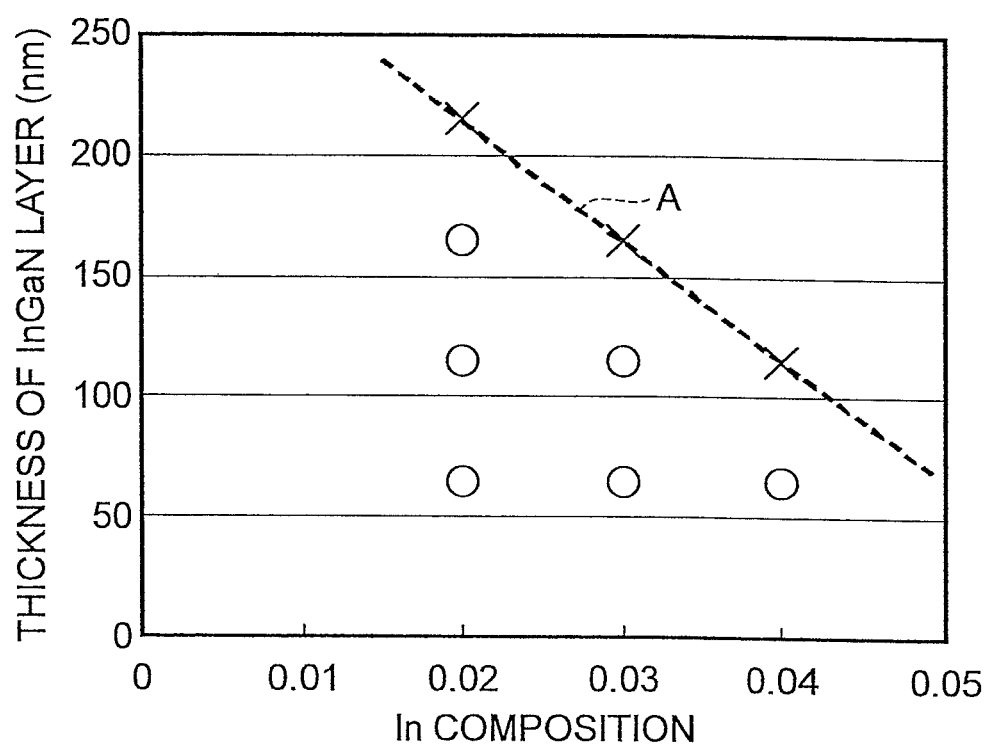
FIG. 3 is a graph showing the experimental results of the state of lasing (luminous efficiency) of a second layer in an optical guiding layer at various indium compositions x2 and thicknesses.

The experimental results of lasing efficiencies of group III nitride semiconductor laser diodes will be explained. In this experiment, the second layers 33 and 37 have various indium compositions x2 and thicknesses. FIG. 3 is a graph showing the results. The vertical axis expresses the thickness of the second layer 33 and 37. The thickness of the second layer 37 is equal to the total thickness of the lower part 37a and the upper part 37b. The horizontal axis expresses the indium composition x2 of the second layer 33 and 37. In FIG. 3, the mark "O" indicates excellent lasing, while the mark "X" indicates poor lasing. In this experiment, the thicknesses of the first layers 31 and 35 are each 100 nm.

As shown in FIG. 3, in case of an indium composition x2 of the second layer 33 and 37 of 0.04, a thickness of 65 nm leads to excellent lasing efficiency, but a thickness of 115 nm leads to low crystalline quality of the active layer 17, resulting in poor lasing efficiency. In case of an indium composition x2 of 0.03, even a thickness of 115 nm leads to excellent lasing efficiency, while a thickness of 165 nm results in poor lasing efficiency. In case of an indium composition x2 of 0.02, a thickness of 165 nm leads to excellent lasing efficiency, but a thickness of 215 nm results in poor lasing efficiency. These results show that the thickness d2 (nm) of the second layer 33 and 37 satisfying the following relation can maintain high crystalline quality of the active layer 17, resulting in the high lasing efficiency.

$$d2 < -5000 \times x2 + 315$$

This relation is shown as a straight line A in FIG. 3. The results also show that the thickness d2 (nm) of the second layer 33 or 37 satisfying the following relation can maintain further high crystalline quality of the active layer 17, resulting in higher lasing efficiency.

$$d2 \leq -5000 \times x2 + 265$$

As in this embodiment, the electron-blocking layer 27 may be provided to separate the second optical guiding layer 23 into two parts arranged in a thickness direction. The gap between the electron-blocking layer 27 and the active layer 17 may be more than or equal to 50 nm.

The primary surface 13a of the group III nitride substrate 13 is semi-polar. A laser diode structure formed on a semi-polar plane, especially on a semi-polar plane having a negative piezoelectric field, leads to a larger effective band offset of the conductive material between the active layer 17 and electron-blocking layer 27, resulting in preventing electrons from leaking to the p-type semiconductor layers. Consequently, the gap between the electron-blocking layer 27 and the active layer 17 can be widened to 50 nm or more, which cannot be readily achieved on the c-plane or a non-polar plane such as the m-plane. This prevents poor luminous efficiency due to strain in the active layer 17 caused by the electron-blocking layer 27. Furthermore, such a wide gap of 50 nm or more between the electron-blocking layer 27 and the active layer 17 prevents the electric field distribution from shifting towards the n-type semiconductor layers and thus effectively reduces the lasing threshold.

Furthermore, as in this embodiment, the primary surface 13a of the group III nitride substrate 13 may be tilted in the m-axis direction of $In_SAl_TGa_{1-S-T}N$ crystal. Thereby indium can be taken easily to the optical guiding layers 21 and 23, and the active layer 17, resulting in luminous efficiency.

Second Embodiment

Figure 4:
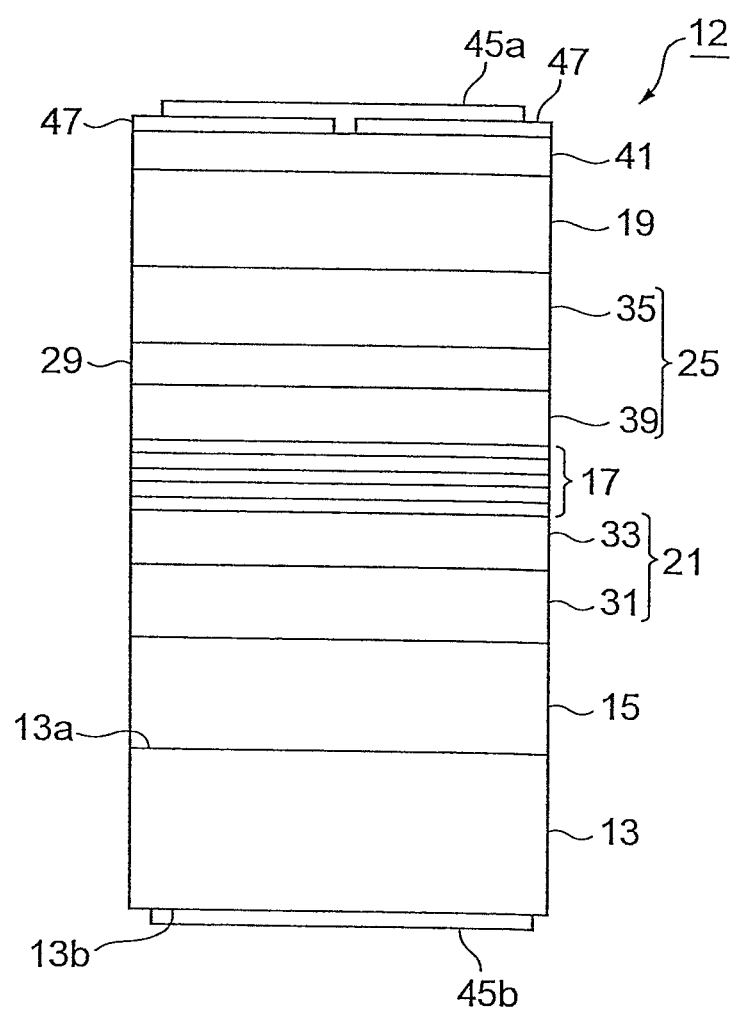
FIG. 4 is a schematic view illustrating the structure of a group III nitride semiconductor laser diode in accordance with a second embodiment.

A group III nitride semiconductor laser diode in accordance with a second embodiment will now be explained. FIG. 4 is a schematic view illustrating the structure of the group III nitride semiconductor laser diode 12. The group III nitride semiconductor laser diode 12 has a gain-guided structure which outputs laser light having a wavelength in the range of 480 nm to 550 nm.

The group III nitride semiconductor laser diode 12 includes a group III nitride substrate 13, an n-type cladding layer 15, an active layer 17, and a p-type cladding layer 19. The n-type cladding layer 15 is provided on the group III nitride substrate 13. The n-type cladding layer 15 functions as a first cladding layer in the embodiment. The active layer 17 is provided on the n-type cladding layer 15. The p-type cladding layer 19 is provided on the active layer 17. The p-type cladding layer 19 functions as a second cladding layer in the embodiment. The group III nitride semiconductor laser diode 12 includes a first optical guiding layer 21 between the n-type cladding layer 15 and the active layer 17. The configurations of the group III nitride substrate 13, the n-type cladding layer 15, the active layer 17, the p-type cladding layer 19, and the first optical guiding layer 21 are similar to those in the first embodiment, and thus the detailed description thereof is omitted. Furthermore, the group III nitride semiconductor laser diode 12 is also similar to the diode 11 in the first embodiment in the following respects. The group III nitride semiconductor laser diode 12 further includes a p-type contact layer 41 provided on the p-type cladding layer 19. An anode electrode 45a is in contact with the p-type contact layer 41 via an aperture formed to an insulating layer 47. A cathode electrode 45b is in contact with the back surface 13b of the group III nitride substrate 13.

The group III nitride semiconductor laser diode 12 includes a second optical guiding layer 25 between the active layer 17 and the p-type cladding layer 19. The second guide layer 25 confine light to the active layer 17 without allowing light to leak to the group III nitride substrate 13, thereby decreasing the threshold voltage.

The second optical guiding layer 25 may include a first layer 35 and a second layer 39. The first layer 35 comprises $In_{x1}Ga_{1-x1}N$ ($0 \leq x1 < 1$). The second layer 39 comprises $In_{x2}Ga_{1-x2}N$ ($x1 < x2 < 1$). The first layer 35 is disposed on the active layer 17. The second layer 39 is disposed between the active layer 17 and the first layer 35. The indium composition x2 of the second layer 39 is higher than the indium composition x1 of the first layer 35. The indium composition x2 is lower than the indium composition of an InGaN well layer of the active layer 17. In an embodiment, the first layer 35 comprises p-type GaN, and the second layer 39 comprises undoped InGaN.

The total thickness of the first layer 35 and the second layer 39 is set to more than 0.1 μm to stabilize a lasing mode. The total thickness of the first layer 35 and the second layer 39 is also set to less than 0.5 μm to increase the optical confinement factor Γ well that can enhance lasing efficiency.

The indium composition x2 in the second layer 39 is preferably in the range of 0.01 to 0.1. Since an indium composition x2 of 0.01 or more can provide a sufficiently high refractive index, the optical confinement factor Γ well can be increased. This further enhances lasing efficiency. Furthermore, an indium composition x2 of 0.1 or less can maintain high crystalline quality in the active layer 17, and thus can achieve high luminous efficiency.

The group III nitride semiconductor laser diode 12 further includes an electron-blocking layer 29. The electron-blocking 29 layer is provided to separate the second optical guiding layer 25 into two parts arranged in a thickness direction. In the present embodiment, the electron-blocking layer 29 is disposed between the first layer 35 and the second layer 39. The electron-blocking layer 29 may comprise, for example, $Al_zGa_{1-z}N$ ($0 < z < 1$). The aluminum composition z is higher than the aluminum composition of p-type cladding layer 19. The gap between the electron-blocking layer 29 and the active layer 17 is preferably more than or equal to 50 nm. The gap is equal to the thickness of the second layer 39 in the present embodiment.

A preferred embodiment is described focusing on points which differ from the first embodiment. A second layer 33 of the first optical guiding layer 21 has a thickness of 65 nm and an indium composition x2 of 0.03. The second layer 39 of the second optical guiding layer 25 has a thickness of 65 nm and an indium composition x2 of 0.03. In this embodiment, the lasing wavelength is 520 nm.

In the group III nitride semiconductor laser diode 12 of the second embodiment, the first optical guiding layer 21 includes a first layer 31 and the second layer 33, and the second optical guiding layer 25 includes the first layer 35 and the second layer 39. The indium compositions x2 in the second layers 33 and 39 adjacent to the active layer 17 are higher than the indium compositions x1 in the first layers 31 and 35. The second layers 33 and 39, each having a higher indium composition, can enhance light confinement to the active layer 17. In addition, the first layers 31 and 35, each having a lower indium composition, contribute to increased thicknesses of the optical guiding layers 21 and 23, while maintaining high crystalline quality of the active layer 17. Consequently, a stable lasing mode can be achieved by the optical guiding layers 21 and 23 each having a thickness exceeding 0.1 μm. This advantage is distinguished in the case where a group III nitride substrate 13 has a semi-polar primary surface.

Also in the present embodiment, the optical guiding layer 21 is disposed between the n-type cladding layer 15 and the active layer 17. The second optical guiding layer 25 is also disposed between the active layer 17 and the p-type cladding layer 19. When a single optical guiding layer provided between the n-type cladding layer 15 and the active layer 17 or between the active layer 17 and the p-type cladding layer 19, a group III nitride semiconductor laser diode also has the same advantage.

Figure 5:
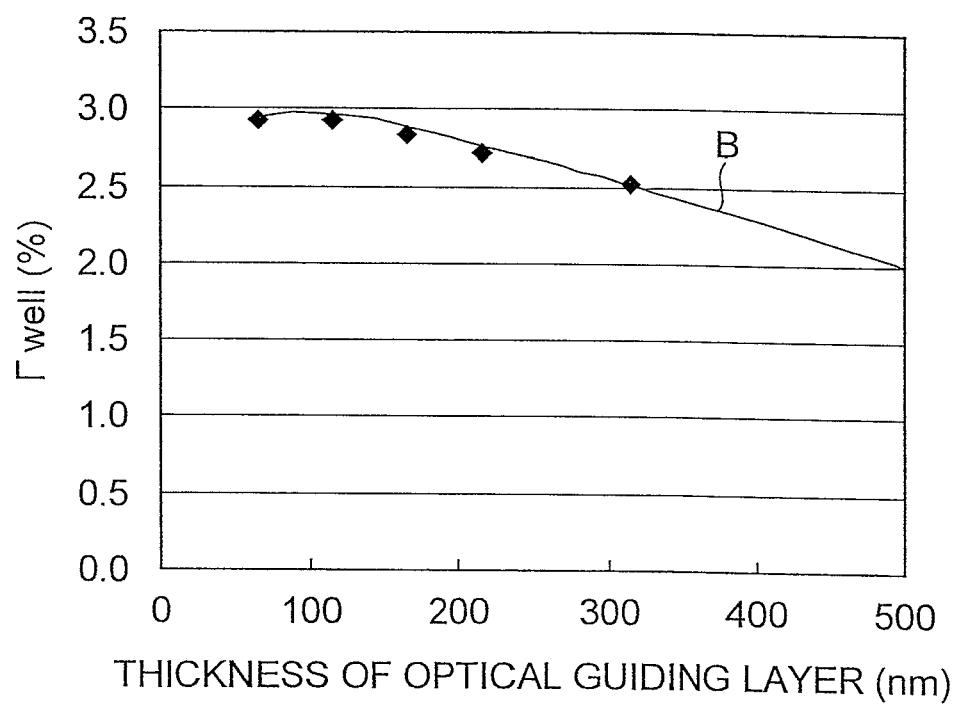
FIG. 5 is a graph of calculated optical confinement factors Γ well at various thicknesses of optical guiding layers.

The results of the optical confinement factors Γ well calculated at various thicknesses of the optical guiding layers 21 and 25 will now be explained. In this calculation, the thicknesses of the first layers 31 and 35 are varied, and the thickness of the second layers 33 and 39 are a constant value of 65 nm. FIG. 5 is a graph showing the results. The vertical axis expresses the optical confinement factors Γ well in percent. The horizontal axis expresses the thicknesses of the optical guiding layers 21 and 25 in nanometer. The plots in FIG. 5 represent the calculated optical confinement factors Γ well. The curve B is an approximate curve thereof. The lasing wavelength of the group III nitride semiconductor laser diode 12 is 520 nm.

As shown in FIG. 5, the larger the thickness of the optical guiding layers 21 and 25, the lower the optical confinement factor Γ well. In the case where the thicknesses of the optical guiding layers 21 and 25 are each 0.1 μm or less, the optical confinement factor Γ well is high, but light leaks to the group III nitride substrate 13, resulting in an unstable lasing mode. On the other hand, in the case where the thicknesses of the optical guiding layers 21 and 25 are each 0.5 μm or more, the optical confinement factor Γ well is below 2%, resulting in the poor lasing efficiency. Accordingly, it is preferable that the thicknesses of the optical guiding layers 21 and 25 are each more than 0.1 μm and less than 0.5 μm.

Figure 6:
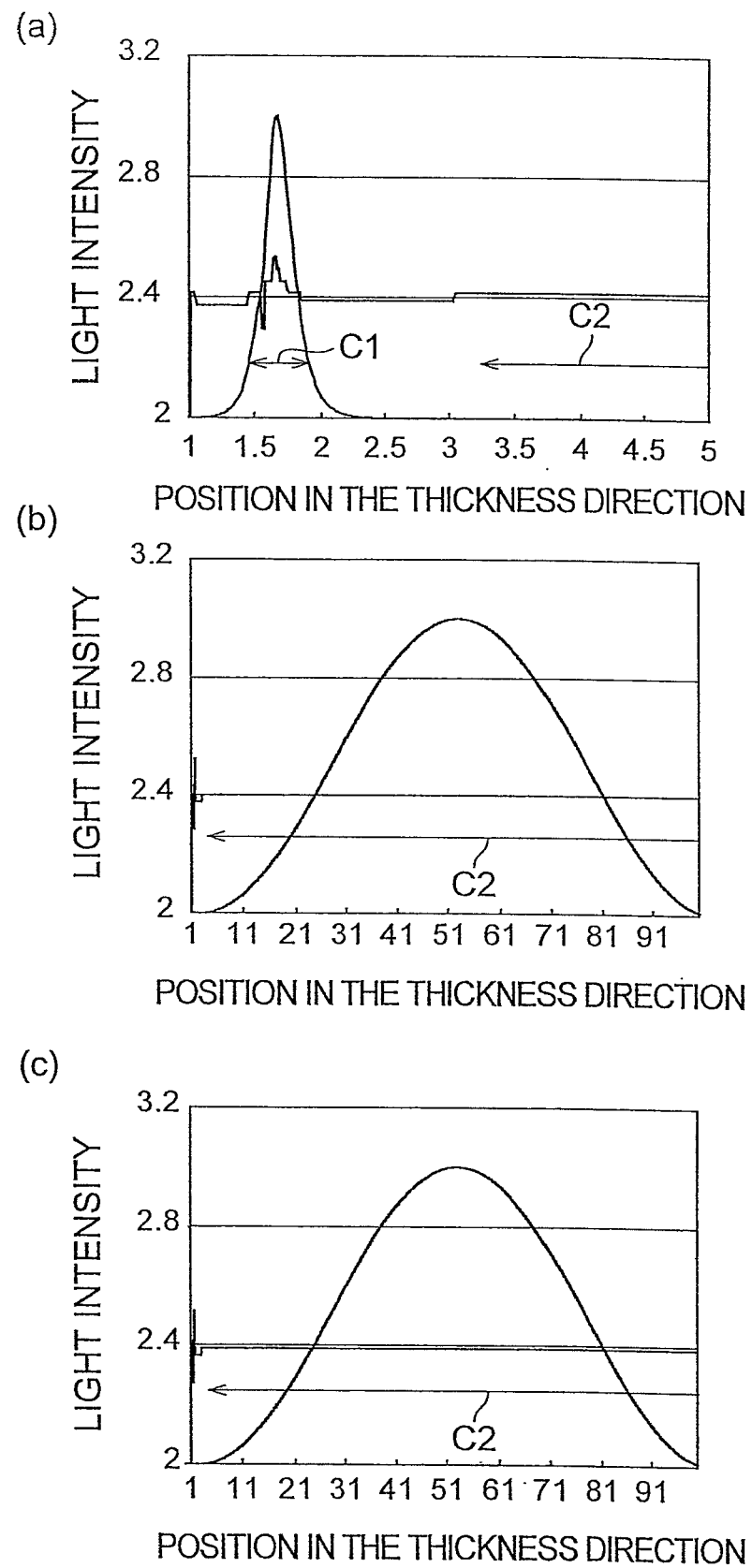
FIG. 6 is a graph of guided wave distributions at various lasing wavelengths in a group III nitride semiconductor laser diode having an optical waveguide layer with a thickness of 390 nm.
Figure 7:
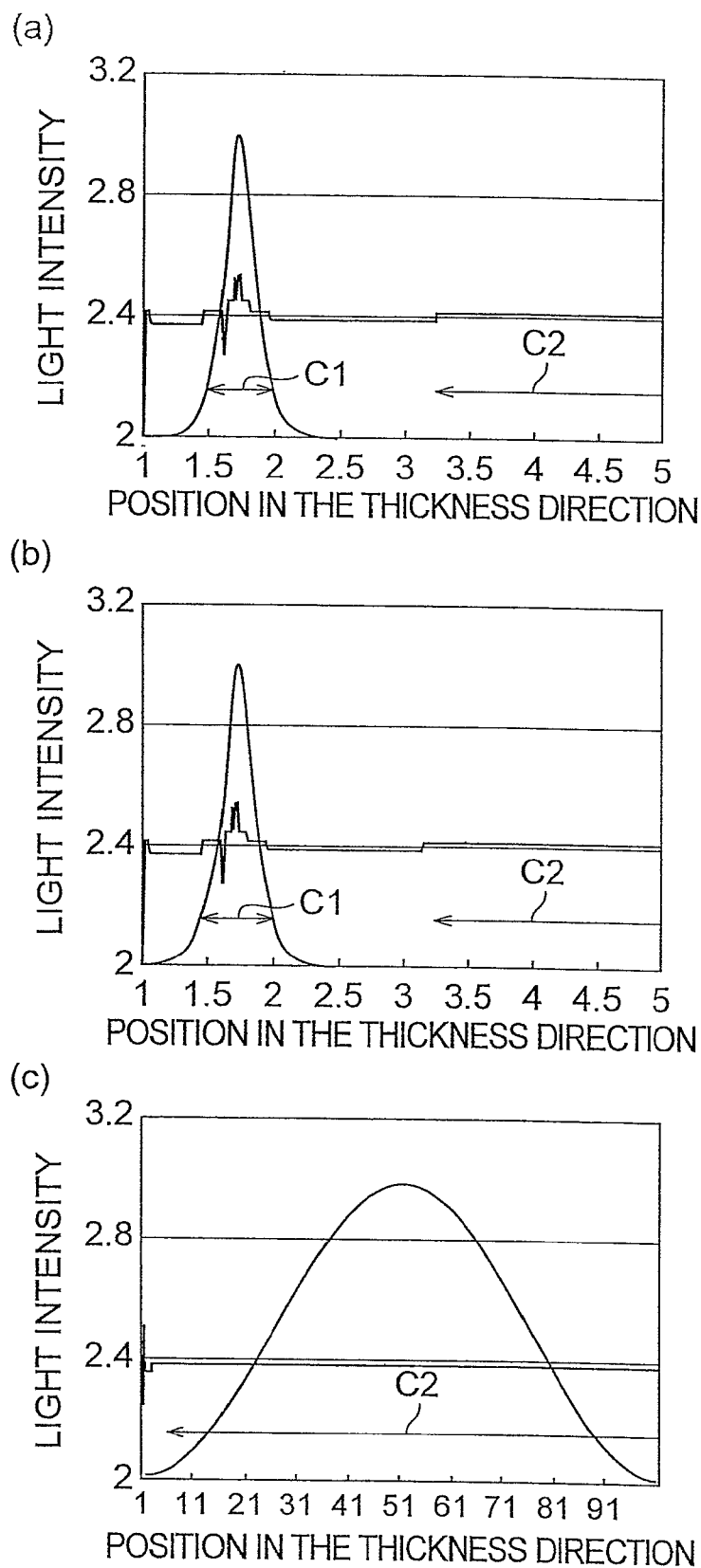
FIG. 7 is a graph of guided wave distributions at various lasing wavelengths in a group III nitride semiconductor laser diode having an optical waveguide layer with a thickness of 490 mm.
Figure 8:
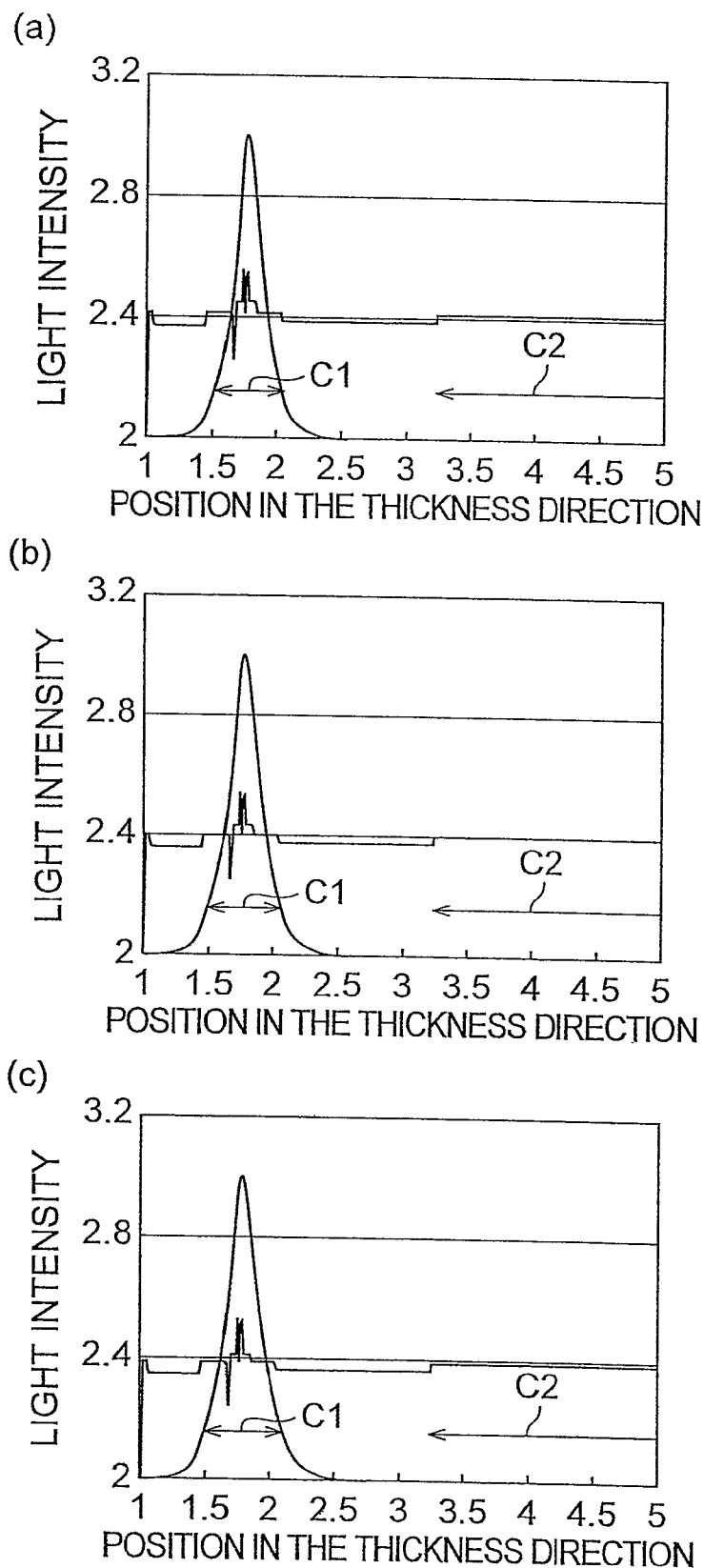
FIG. 8 is a graph of guided wave distributions at various lasing wavelengths in a group III nitride semiconductor laser diode having an optical waveguide layer with a thickness of 590 nm.

FIGS. 6 to 8 are graphs of guided wave distributions at various lasing wavelengths and at various thicknesses of the optical guiding layers 21 and 25, as described above. In FIGS. 6 to 8, the vertical axis expresses the light intensity, while the horizontal axis expresses the position in the thickness direction of the group III nitride semiconductor laser diode 12. The section C1 expresses the range of the optical waveguide layers (the optical guiding layers 21 and 25, and active layer 17). The section C2 expresses the range of the group III nitride substrate 13. FIG. 6 is a graph for an optical waveguide layer with a thickness of 390 nm. FIG. 7 is a graph for an optical waveguide layer with a thickness of 490 nm. FIG. 8 is a graph for an optical waveguide layer with a thickness of 590 nm. Part (a) of FIGS. 6 to 8 are graphs for a lasing wavelength of 480 nm. Part (b) of FIGS. 6 to 8 are graphs for a lasing wavelength of 500 nm. Part (c) of FIGS. 6 to 8 are graphs for a lasing wavelength of 520 nm.

In the case where the thickness of the optical waveguide layer is relatively thin as 390 nm, light with a lasing wavelength of 500 nm or longer was not confined to the optical waveguide layer, and a stable lasing mode was observed in the group III nitride substrate 13 (the section C2), as shown in Part (b) and (c) of FIG. 6. In contrast, light with a lasing wavelength of 480 nm was confined effectively to the optical waveguide layer (the section C1), as shown in Part (a) of FIG. 6. The optical confinement factor Γ well was 3.10.

In the case of a thickness of the optical waveguide layer of 490 nm, the lasing wavelength of 520 nm or longer resulted in a stable lasing mode in the group III nitride substrate 13 (the section C2), as shown in Part (c) of FIG. 7. In contrast, a lasing wavelength of 500 nm or shorter resulted in effective confinement of light to the optical waveguide layer (the section C1), as shown in Part (a) and (b) of FIG. 7. The optical confinement factor Γ well was 2.94 at the wavelength of 480 nm. The optical confinement factor Γ well was 2.74 at the wavelength of 500 nm.

In the case of a thickness of the optical waveguide layer of 590 nm, as shown in Part (a), (b) and (c) of FIG. 8, light was confined within the optical waveguide layer (the section C1) with a lasing wavelength in the range of 480 nm to 520 nm. The optical confinement factors Γ well were 2.82, 2.62 and 2.45 at a wavelength of 480 nm, 500 nm and 520 nm, respectively.

These results shows that light with a longer lasing wavelength more easily leaks from the optical waveguide layer, resulting in a readily stabilized lasing mode in the group III nitride substrate 13. As a countermeasure to this phenomenon, a lasing mode can be stabilized by increasing the thickness of the optical waveguide layers (the optical guiding layers 21 and 25, and the active layer 17).

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A group III nitride semiconductor laser diode comprising:
   a group III nitride substrate having a semi-polar primary surface;
   a first cladding layer having a first conductivity type, the first cladding layer comprising aluminum-containing group III nitride, the first cladding layer being provided on the group III nitride substrate;
   an active layer provided on the first cladding layer;
   a second cladding layer having a second conductivity type, the second cladding layer comprising aluminum-containing group III nitride, the second cladding layer being provided on the active layer;
   an optical guiding layer provided between the first cladding layer and the active layer and/or between the second cladding layer and the active layer, the optical guiding layer comprising a first layer and a second layer, the first layer comprising $In_{x1}Ga_{1-x1}N$ ($0 \leq x1 < 1$), the second layer comprising $In_{x2}Ga_{1-x2}N$ ($x1 < x2 < 1$), the second layer being provided between the first layer and the active layer, and the total thickness of the first layer and the second layer being greater than 0.1 μm; and
   the wavelength of laser light being in a range of 480 nm to 550 nm;
   wherein the optical guiding layer is provided between the first cladding layer and the active layer; and
   wherein group III nitride semiconductor laser diode further comprises:
      a second optical guiding layer provided between the second cladding layer and the active layer, the second optical guiding layer comprising a first layer and a second layer, the first layer comprising $In_{x1}Ga_{1-x1}N$ ($0 \leq x1 < 1$), the second layer comprising $In_{x2}Ga_{1-x2}N$ ($x1 < x2 < 1$), the second layer being provided between the first layer and the active layer, and the total thickness of the first layer and the second layer being greater than 0.1 μm.

2. A group III nitride semiconductor laser diode comprising:
   a group III nitride substrate having a semi-polar primary surface;
   a first cladding layer having a first conductivity type, the first cladding layer comprising aluminum-containing group III nitride, the first cladding layer being provided on the group III nitride substrate;
   an active layer provided on the first cladding layer;
   a second cladding layer having a second conductivity type, the second cladding layer comprising aluminum-containing group III nitride, the second cladding layer being provided on the active layer;
   an optical guiding layer provided between the first cladding layer and the active layer and/or between the second cladding layer and the active layer, the optical guiding layer comprising a first layer and a second layer, the first layer comprising $In_{x1}Ga_{1-x1}N$ ($0 \leq x1 < 1$), the second layer comprising $In_{x2}Ga_{1-x2}N$ ($x1 < x2 < 1$), the second layer being provided between the first layer and the active layer, and the total thickness of the first layer and the second layer being greater than 0.1 μm and less than 0.5 μm;
   an electron-blocking layer, the optical guiding layer being provided between the second cladding layer and the active layer, the optical guiding layer being separated by the electron-blocking layer into two parts arranged in a thickness direction; and
   the wavelength of laser light being in a range of 480 nm to 550 nm;
   wherein the optical guiding layer is provided between the first cladding layer and the active layer; and
   wherein group III nitride semiconductor laser diode further comprises:
      a second optical guiding layer provided between the second cladding layer and the active layer, the second optical guiding layer comprising a first layer and a second layer, the first layer comprising $In_{x1}Ga_{1-x1}N$ ($0 \leq x1 < 1$), the second layer comprising $In_{x2}Ga_{1-x2}N$ ($x1 < x2 < 1$), the second layer being provided between the first layer and the active layer, and the total thickness of the first layer and the second layer being greater than 0.1 μm and less than 0.5 μm.

3. A group III nitride semiconductor laser diode comprising:
   a group III nitride substrate having a semi-polar primary surface;
   a first cladding layer having a first conductivity type, the first cladding layer comprising aluminum-containing group III nitride, the first cladding layer being provided on the group III nitride substrate;
   an active layer provided on the first cladding layer;
   a second cladding layer having a second conductivity type, the second cladding layer comprising aluminum-containing group III nitride, the second cladding layer being provided on the active layer;
   an optical guiding layer provided between the first cladding layer and the active layer and/or between the second cladding layer and the active layer, the optical guiding layer comprising a first layer and a second layer, the first layer comprising $In_{x1}Ga_{1-x1}N$ ($0 \leq x1 < 1$), the second layer comprising $In_{x2}Ga_{1-x2}N$ ($x1 < x2 < 1$), the second layer being provided between the first layer and the active layer, and the total thickness of the first layer and the second layer being greater than 0.1 µm and less than 0.5 µm;

an electron-blocking layer, the optical guiding layer being provided between the second cladding layer and the active layer, the optical guiding layer being separated by the electron-blocking layer into two parts arranged in a thickness direction, a gap between the electron-blocking layer and the active layer being more than or equal to 50 nm; and the wavelength of laser light being in a range of 480 nm to 550 nm;

wherein the optical guiding layer is provided between the first cladding layer and the active layer; and wherein group III nitride semiconductor laser diode further comprises:

a second optical guiding layer provided between the second cladding layer and the active layer, the second optical guiding layer comprising a first layer and a second layer, the first layer comprising $In_{x1}Ga_{1-x1}N$ ($0 \leq x1 < 1$), the second layer comprising $In_{x2}Ga_{1-x2}N$ ($x1 < x2 < 1$), the second layer being provided between the first layer and the active layer, and the total thickness of the first layer and the second layer being greater than 0.1 µm and less than 0.5 µm.

4. The group III nitride semiconductor laser diode according to claim 1, further comprising an electron-blocking layer;

wherein the second optical guiding layer is separated by the electron-blocking layer into two parts arranged in a thickness direction.

5. The group III nitride semiconductor laser diode according to claim 4, wherein a gap between the electron-blocking layer and the active layer is more than or equal to 50 nm.

6. The group III nitride semiconductor according to claim 1, wherein the total thickness of the first layer and the second layer of the optical guiding layer and the total thickness of the first layer and the second layer of the second optical guiding layer are less than 0.5 µm.

7. The group III nitride semiconductor laser diode according to claim 1, an indium composition x2 in the second layer of the optical guiding layer and an indium composition x2 in the second layer of the second optical guiding layer are in a range of 0.01 to 0.1.

8. The group III nitride semiconductor laser diode according to claim 1, the thickness d2 (nm) of the second layer of the optical guiding layer and the thickness d2 (nm) of the second layer of the second optical guiding layer satisfy the following relation:

$$d2 < -5000 \times x2 + 315$$

where x2 is an indium composition in the second layer of the optical guiding layer and the second layer of the second optical guiding layer.

9. The Group III nitride semiconductor laser diode according to claim 1, wherein the Group III nitride substrate comprises GaN.

10. The group III nitride semiconductor laser diode according to claim 9, wherein the primary surface is tilted at an angle of more than or equal to 63 degrees and less than 80 degrees with respect to one of the (0001) plane and the (000-1) plane of the GaN.

11. The group III nitride semiconductor laser diode according to claim 9, wherein the group III nitride substrate comprises $In_SAl_TGa_{1-S-T}N$ ($0 < S < 1$, $0 < T < 1$, $0 < S+T < 1$), and the primary surface is tilted at an angle of more than or equal to 10 degrees and less than 90 degrees with respect to one of a (0001) plane and a (000-1) plane of the $In_SAl_TGa_{1-S-T}N$ crystal.

12. The group III nitride semiconductor laser diode according to claim 9, the primary surface is tilted in an m-axis direction of the GaN.

13. The group III nitride semiconductor laser diode according to claim 2, an indium composition x2 in the second layer of the optical guiding layer and an indium composition x2 in the second layer of the second optical guiding layer are in a range of 0.01 to 0.1.

14. The group III nitride semiconductor laser diode according to claim 2, the thickness d2 (nm) of the second layer of the optical guiding layer and the thickness d2 (nm) of the second layer of the second optical guiding layer satisfy the following relation:

$$d2 < -5000 \times x2 + 315$$

where x2 is an indium composition in the second layer of the optical guiding layer and the second layer of the second optical guiding layer.

15. The Group III nitride semiconductor laser diode according to claim 2, wherein the Group III nitride substrate comprises GaN.

16. The group III nitride semiconductor laser diode according to claim 15, wherein the primary surface is tilted at an angle of more than or equal to 63 degrees and less than 80 degrees with respect to one of the (0001) plane and the (000-1) plane of the GaN.

17. The group III nitride semiconductor laser diode according to claim 15, wherein the group III nitride substrate comprises $In_SAl_TGa_{1-S-T}N$ ($0 < S < 1$, $0 < T < 1$, $0 < S+T < 1$), and the primary surface is tilted at an angle of more than or equal to 10 degrees and less than 90 degrees with respect to one of a (0001) plane and a (000-1) plane of the $In_SAl_TGa_{1-S-T}N$ crystal.

18. The group III nitride semiconductor laser diode according to claim 15, the primary surface is tilted in an m-axis direction of the GaN.

19. The group III nitride semiconductor laser diode according to claim 3, an indium composition x2 in the second layer of the optical guiding layer and an indium composition x2 in the second layer of the second optical guiding layer are in a range of 0.01 to 0.1.

20. The group III nitride semiconductor laser diode according to claim 3, the thickness d2 (nm) of the second layer of the optical guiding layer and the thickness d2 (nm) of the second layer of the second optical guiding layer satisfy the following relation:

$$d2 < -5000 \times x2 + 315$$

where x2 is an indium composition in the second layer of the optical guiding layer and the second layer of the second optical guiding layer.

* * * * *

UNITED STATES PATENT AND TRADEMARK OFFICE
CERTIFICATE OF CORRECTION

PATENT NO. : 8,619,828 B2
APPLICATION NO. : 12/836065
DATED : December 31, 2013
INVENTOR(S) : Akita et al.

It is certified that error appears in the above-identified patent and that said Letters Patent is hereby corrected as shown below:

On the Title Page, Item (73) Assignee: "Sumitomo Electronic Industries, Ltd., Osaka-shi (JP)" should be -- Sumitomo Electric Industries, Ltd., Osaka-shi (JP) --

Signed and Sealed this
Twenty-second Day of July, 2014

Michelle K. Lee
*Deputy Director of the United States Patent and Trademark Office*